(12) United States Patent
Chang et al.

(10) Patent No.: US 10,553,481 B2
(45) Date of Patent: Feb. 4, 2020

(54) VIAS FOR COBALT-BASED INTERCONNECTS AND METHODS OF FABRICATION THEREOF

(71) Applicant: Taiwan Semiconductor Manufacturing Co., Ltd., Hsinchu (TW)

(72) Inventors: Yu-Jen Chang, Hsinchu (TW); Min-Yann Hsieh, Kaohsiung (TW); Hua Feng Chen, Hsinchu (TW); Kuo-Hua Pan, Hsinchu (TW)

(73) Assignee: TAIWAN SEMICONDUCTOR MANUFACTURING CO., LTD. (TW)

( * ) Notice: Subject to any disclaimer, the term of this patent is extended or adjusted under 35 U.S.C. 154(b) by 0 days.

(21) Appl. No.: 15/692,212

(22) Filed: Aug. 31, 2017

(65) Prior Publication Data

US 2019/0067093 A1 Feb. 28, 2019

(51) Int. Cl.
*H01L 21/768* (2006.01)
*H01L 23/532* (2006.01)
*H01L 23/522* (2006.01)

(52) U.S. Cl.
CPC .. *H01L 21/76846* (2013.01); *H01L 21/76873* (2013.01); *H01L 21/76886* (2013.01); *H01L 23/5226* (2013.01); *H01L 23/53209* (2013.01); *H01L 23/53266* (2013.01); *H01L 23/53295* (2013.01)

(58) Field of Classification Search
CPC ........... H01L 21/76846; H01L 23/5226; H01L 21/76873; H01L 23/53209; H01L 21/76886
See application file for complete search history.

(56) References Cited

U.S. PATENT DOCUMENTS

| 7,329,599 B1 * | 2/2008 | Wirbeleit | .............. | H01L 21/265 257/E21.199 |
| 9,287,170 B2 | 3/2016 | Lee et al. | | |
| 9,472,502 B1 | 10/2016 | Lee et al. | | |

(Continued)

FOREIGN PATENT DOCUMENTS

| CN | 106356331 A | 1/2017 |
| KR | 20010048188 A1 | 6/2001 |

(Continued)

*Primary Examiner* — Bilkis Jahan
*Assistant Examiner* — Victor V Barzykin
(74) *Attorney, Agent, or Firm* — Haynes and Boone, LLP

(57) ABSTRACT

Interconnect structures and corresponding techniques for forming the interconnect structures are disclosed herein. An exemplary interconnect structure includes a conductive feature that includes cobalt and a via disposed over the conductive feature. The via includes a first via barrier layer disposed over the conductive feature, a second via barrier layer disposed over the first via barrier layer, and a via bulk layer disposed over the second via barrier layer. The first via barrier layer includes titanium, and the second via barrier layer includes titanium and nitrogen. The via bulk layer can include tungsten and/or cobalt. A capping layer may be disposed over the conductive feature, where the via extends through the capping layer to contact the conductive feature. In some implementations, the capping layer includes cobalt and silicon.

20 Claims, 6 Drawing Sheets

(56) References Cited

U.S. PATENT DOCUMENTS

| | | | |
|---|---|---|---|
| 9,514,983 B2* | 12/2016 | Jezewski | H01L 23/485 |
| 9,721,889 B1 | 8/2017 | Niu et al. | |
| 9,824,970 B1* | 11/2017 | Zhang | H01L 23/528 |
| 2005/0023702 A1* | 2/2005 | Nishimura | H01L 21/28556 |
| | | | 257/774 |
| 2011/0272765 A1* | 11/2011 | Seo | H01L 23/485 |
| | | | 257/410 |
| 2014/0183738 A1 | 7/2014 | Jezewski et al. | |
| 2014/0327140 A1 | 11/2014 | Zhang et al. | |
| 2015/0061147 A1* | 3/2015 | Lin | H01L 23/53238 |
| | | | 257/774 |
| 2018/0130703 A1* | 5/2018 | Sardesai | H01L 21/76849 |

FOREIGN PATENT DOCUMENTS

| | | | |
|---|---|---|---|
| KR | 20150070339 A | 6/2015 | |
| TW | 200713499 A | 4/2007 | |
| TW | 201533845 A | 9/2015 | |
| TW | 201725682 A | 7/2017 | |

* cited by examiner

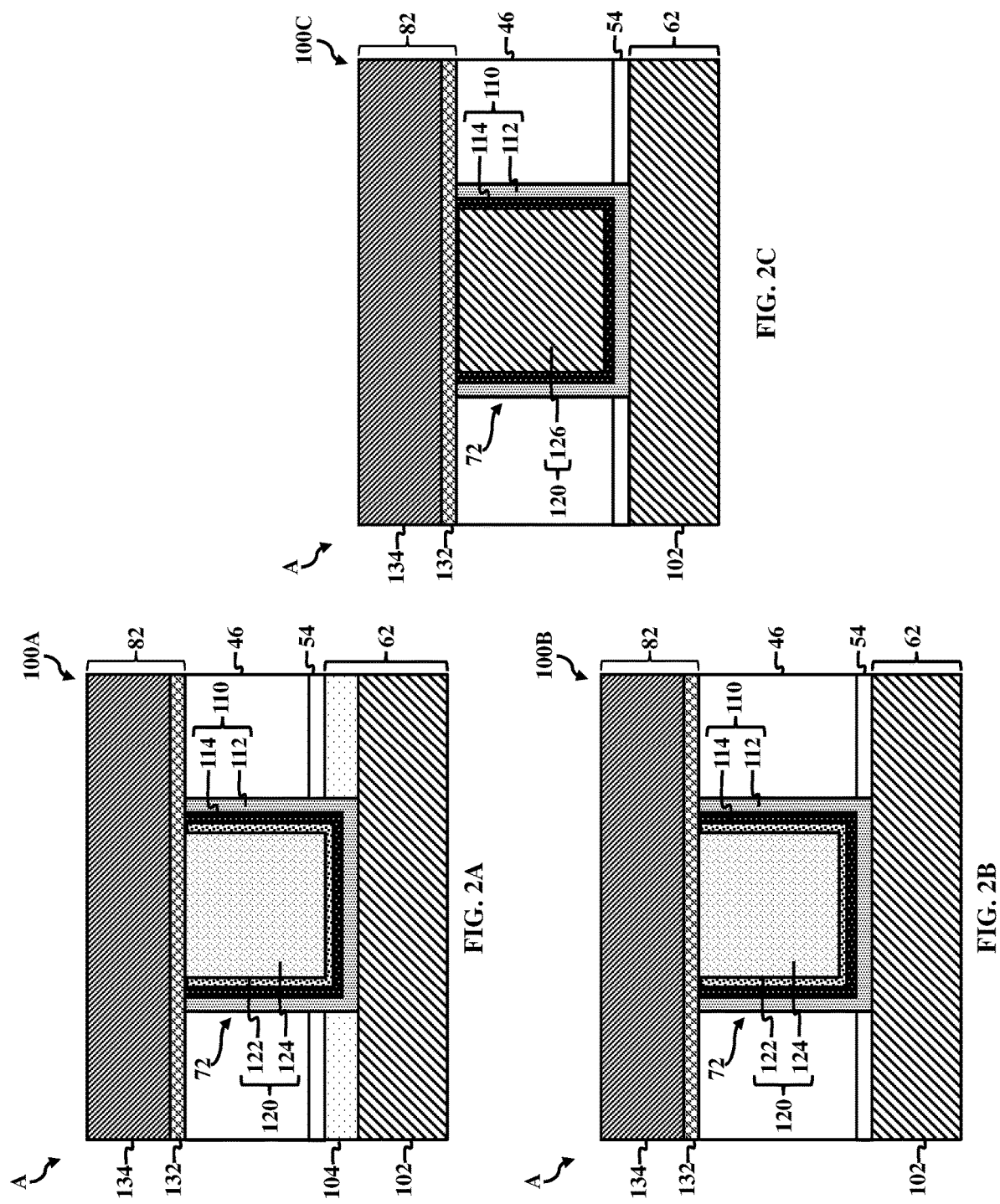

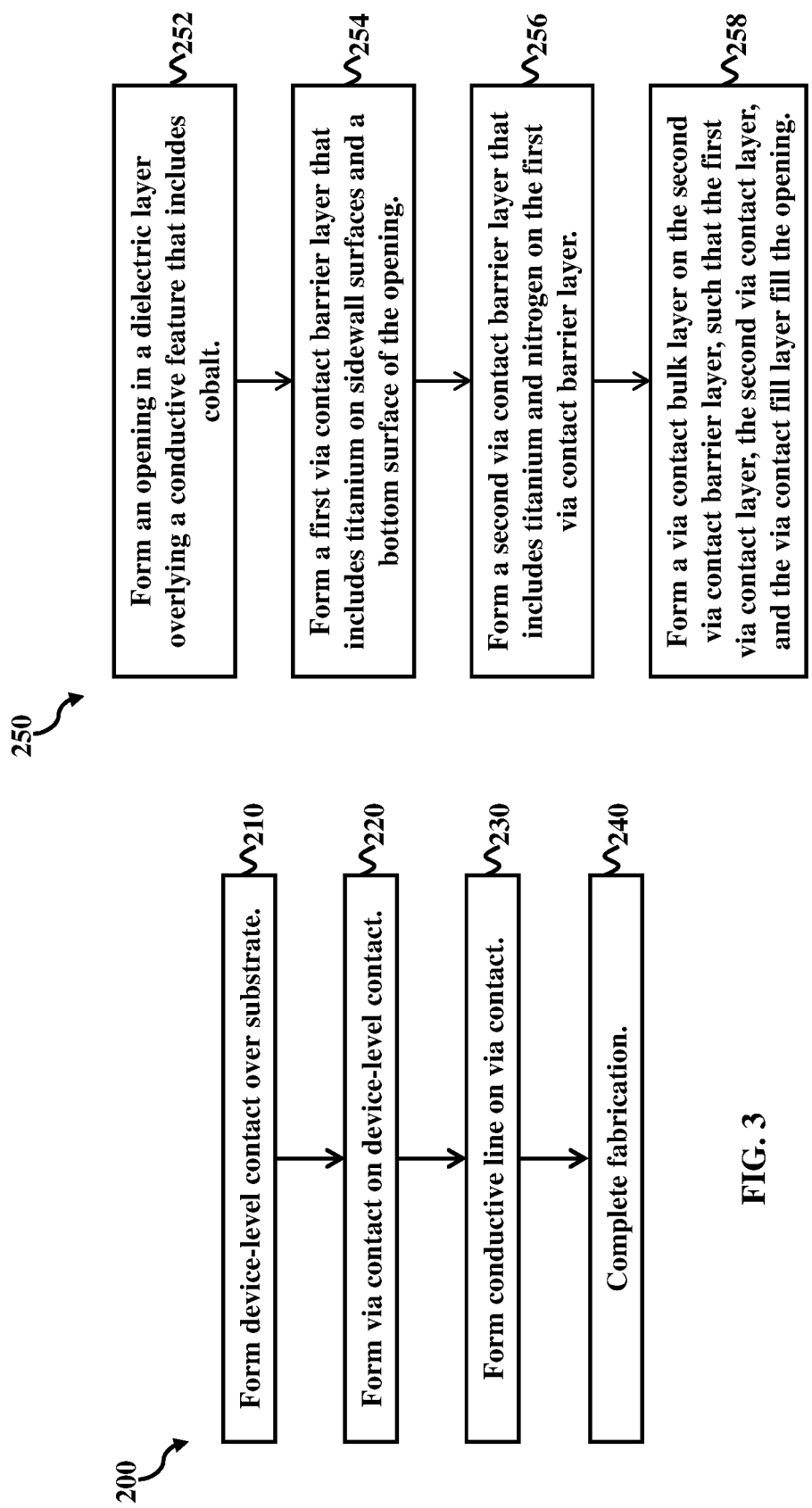

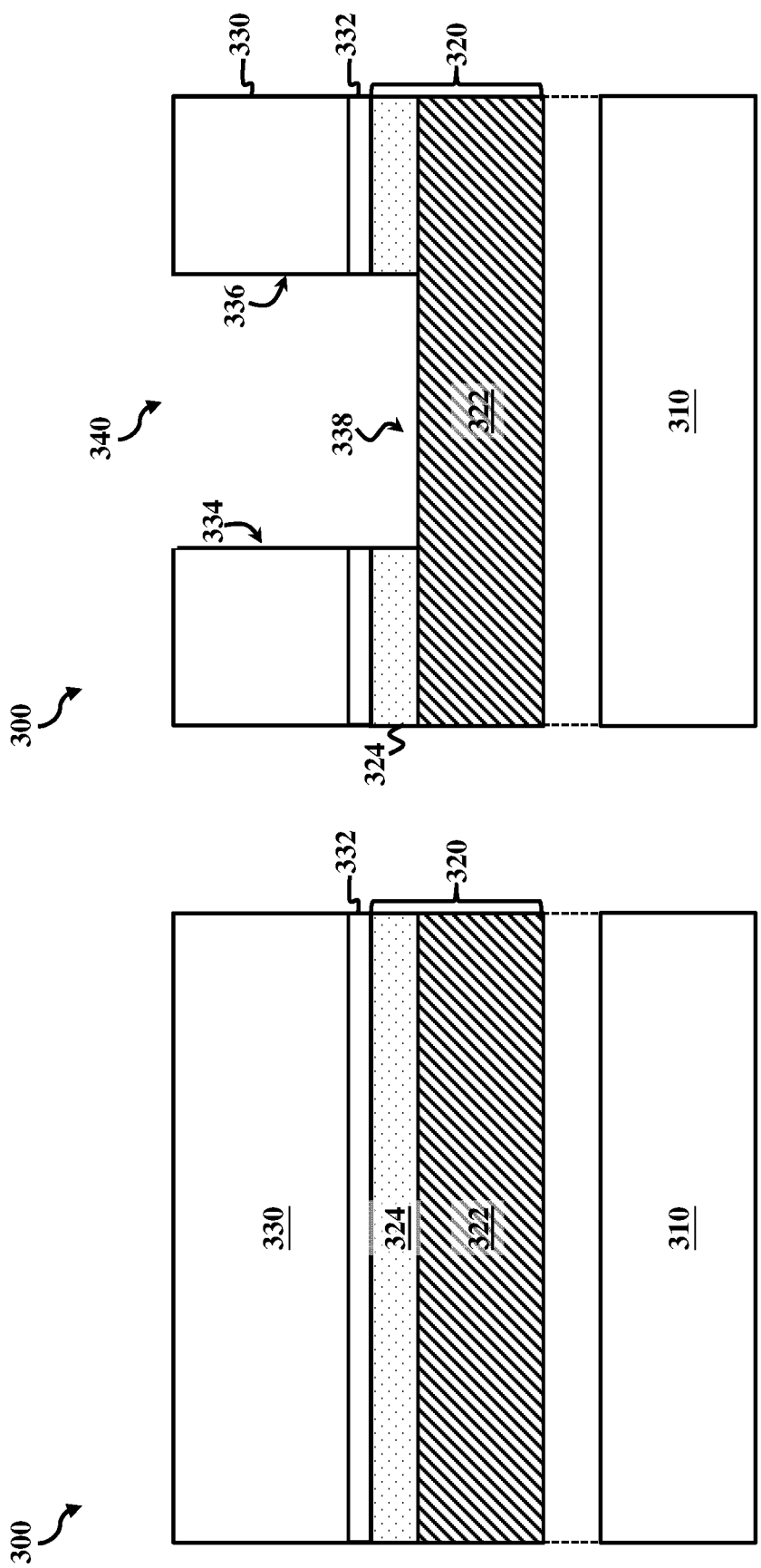

VIAS FOR COBALT-BASED INTERCONNECTS AND METHODS OF FABRICATION THEREOF

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, copper-based interconnect structures typically implemented in multilayer interconnect (MLI) features have presented performance, yield, and cost challenges as MLI features become more compact with ever-shrinking IC feature size. For example, copper interconnects exhibit increased resistance, poor electromigration performance, and voids during fabrication as IC technologies expand into sub-20 nm technology nodes. Accordingly, although existing interconnect structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is an enlarged fragmentary diagrammatic view of the integrated circuit device of FIG. 1 when implementing an interconnect structure, in portion or entirety, according to various aspects of the present disclosure.

FIG. 2B is an enlarged fragmentary diagrammatic view of the integrated circuit device of FIG. 1 when implementing another interconnect structure, in portion or entirety, according to various aspects of the present disclosure.

FIG. 2C is an enlarged fragmentary diagrammatic view of the integrated circuit device of FIG. 1 when implementing yet another interconnect structure, in portion or entirety, according to various aspects of the present disclosure.

FIG. 3 is a flow chart of a method for fabricating an interconnect structure, such as the interconnect structures depicted in FIG. 1 and/or FIGS. 2A-2C, according to various aspects of the present disclosure.

FIG. 4 is a flow chart of a method for fabricating a via of an interconnect structure, such as the interconnect structures depicted in FIG. 1 and/or FIGS. 2A-2C, according to various aspects of the present disclosure.

FIGS. 5A-5F are fragmentary diagrammatic views of an interconnect structure, in portion or entirety, at various fabrication stages (such as those associated with the method of FIG. 3 and/or FIG. 4) according to various aspects of the present disclosure.

DETAILED DESCRIPTION

Figure 1:
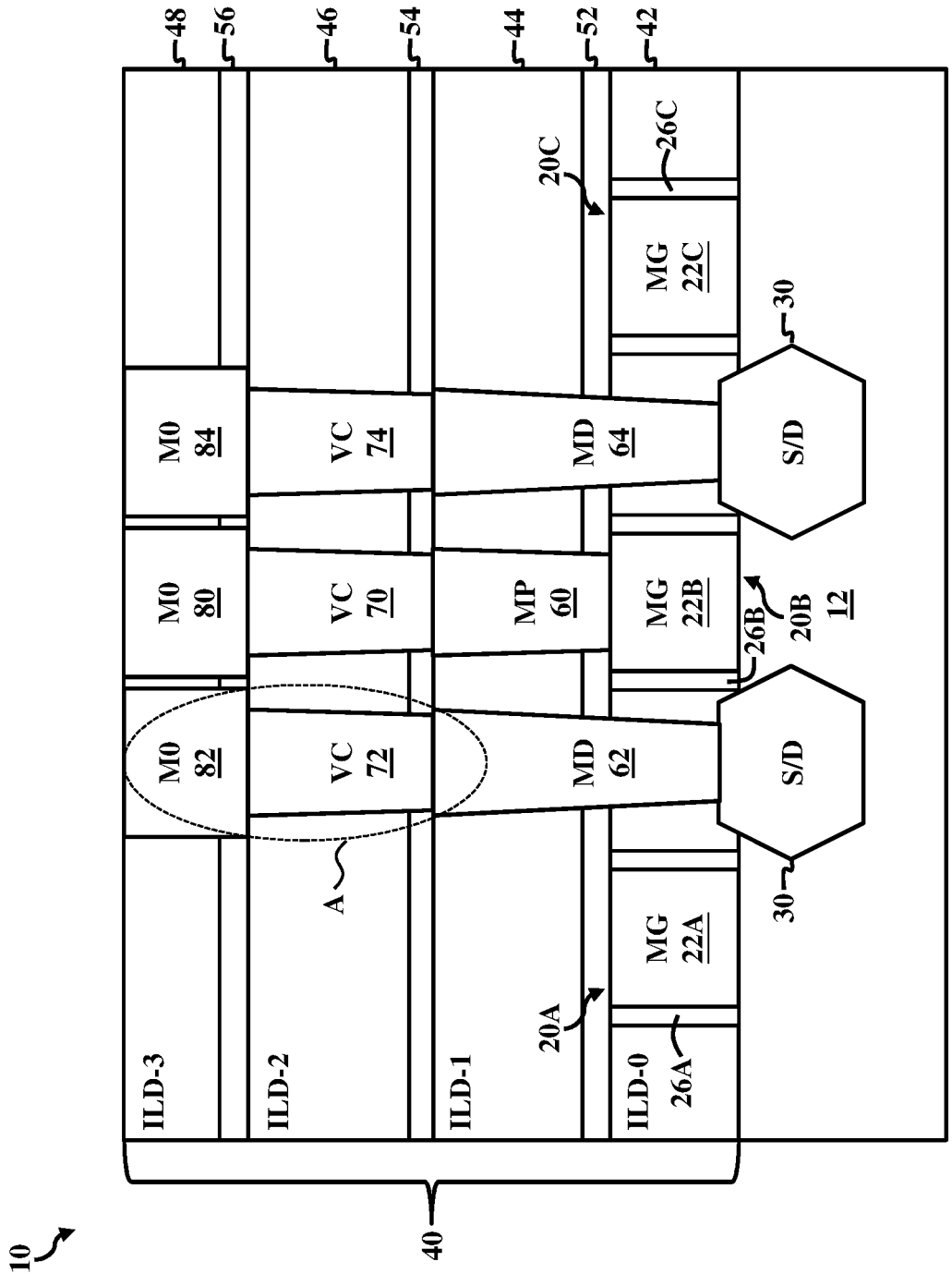
FIG. 1 is a fragmentary diagrammatic view of an integrated circuit device, in portion or entirety, according to various aspects of the present disclosure.

The present disclosure relates generally to integrated circuit devices, and more particularly, to interconnect structures for integrated circuit devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating interconnect structures that interconnect IC features fabricated by FEOL process (referred to herein as FEOL features or structures) and MEOL processes (referred to herein as MEOL features or structures), thereby enabling operation of the IC devices. For example, BEOL processes can include forming multilayer interconnect features that facilitate operation of the IC devices. As integrated circuit (IC) technologies progress towards smaller technology nodes, BEOL processes have been observed to damage MEOL features and/or FEOL features. The present disclosure explores improved interconnect structures for protecting MEOL features and/or FEOL features from damage arising from BEOL processes.

FIG. 1 is a fragmentary diagrammatic view of an integrated circuit device 10, in portion or entirety, according to various aspects of the present disclosure. Integrated circuit device 10 may be included in a microprocessor, a memory, and/or other integrated circuit device. In some implementations, integrated circuit device 10 is a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 1 has been simplified for the sake of clarity to better understand the inventive concepts of the present disclosure. Additional features can be added in integrated circuit device 10, and some of the features described below can be replaced, modified, or eliminated in other embodiments of integrated circuit device 10.

Integrated circuit device 10 includes a substrate (wafer) 12. In the depicted embodiment, substrate 12 includes silicon. Alternatively or additionally, substrate 12 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 12 can include various doped regions (not shown) depending on design requirements of integrated circuit device 10. In some implementations, substrate 12 includes p-type doped regions (for example, p-type wells) doped with p-type dopants, such as boron (for example, $BF_2$), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. The various doped regions can be formed directly on and/or in substrate 12, for example, providing a p-well structure, an n-well structure, a dual-well structure, a raised structure, or combinations thereof. An ion implantation process, a diffusion process, and/or other suitable doping process can be performed to form the various doped regions.

An isolation feature(s) (not shown) is formed over and/or in substrate 12 to isolate various regions, such as various device regions, of integrated circuit device 10. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

Various gate structures are disposed over substrate 12, such as a gate structure 20A, a gate structure 20B, and a gate structure 20C. In some implementations, one or more of gate structures 20A-20C interpose a source region and a drain region, where a channel region is defined between the source region and the drain region. The one or more gate structures 20A-20C engage the channel region, such that current can flow between the source/drain regions during operation. In some implementations, gate structures 20A-20C are formed over a fin structure, such that gate structures 20A-20C each wrap a portion of the fin structure. For example, one or more of gate structures 20A-20C wrap channel regions of the fin structure, thereby interposing a source region and a drain region of the fin structure. Gate structures 20A-20C include metal gate (MG) stacks, such as metal gate stack 22A, metal gate stack 22B, and metal gate stack 22C. Metal gate stacks 22A-22C are configured to achieve desired functionality according to design requirements of integrated circuit device 10, such that metal gate stacks 22A-22C include the same or different layers and/or materials. In some implementations, metal gate stacks 22A-22C include a gate dielectric (for example, a gate dielectric layer) and a gate electrode (for example, a work function layer and a bulk conductive layer). Metal gate stacks 22A-22C may include numerous other layers, for example, capping layers, interface layers, diffusion layers, barrier layers, hard mask layers, or combinations thereof. In some implementations, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer is a high-k dielectric layer. The gate electrode includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the conductive bulk layer is a conductive layer formed over the work function layer. In some implementations, the work function layer includes n-type work function materials, such as Ti, silver (Ag), TaAl, TaAlC, TiAlN, TaC, TaCN, TaSiN, manganese (Mn), zirconium (Zr), other suitable n-type work function materials, or combinations thereof. In some implementations, the work function layer includes a p-type work function material, such as TiN, TaN, ruthenium (Ru), Mo, Al, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof.

Gate structures 20A-20C are formed by deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Metal gate stacks 22A-22C are fabricated according to a gate last process, a gate first process, or a hybrid gate last/gate first process. In gate last process implementations, gate structures 20A-20D include dummy gate stacks that are subsequently replaced with metal gate stacks 22A-22C. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 22A-22C are formed.

Gate structures 20A-20C further include spacers 26A-26C, which are disposed adjacent to (for example, along sidewalls of) metal gate stacks 22A-22C, respectively. Spacers 26A-26C are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form spacers 26A-26C. In some implementations, spacers 26A-26C include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to metal gate stacks 22A-22C. In such implementations, the various sets of spacers can include materials having different etch rates. For example, a first dielectric layer including silicon and oxygen (for example, silicon oxide) can be deposited over substrate 12 and subsequently anisotropically etched to form a first spacer set adjacent to metal gate stacks 22A-22C (or dummy metal gate stacks, in some implementations), and a second dielectric layer including silicon and nitrogen (for example, silicon nitride) can be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 12 before and/or after forming spacers 26A-26C, depending on design requirements of integrated circuit device 10.

Epitaxial source features and epitaxial drain features (referred to as epitaxial source/drain features) are disposed in source/drain regions of substrate 12. For example, a semiconductor material is epitaxially grown on substrate 12, forming epitaxial source/drain features 30 over a source region and a drain region of substrate 12. In the depicted embodiment, gate structure 20B interposes epitaxial source/drain features 30, and a channel region is defined between epitaxial source/drain features 30. Gate structure 20B and epitaxial source/drain features 30 thus form a portion of a transistor, such a pull-up transistor or a pull-down transistor, of integrated circuit device 10. Gate structure 20B and/or epitaxial source/drain features 30 are thus alternatively referred to as device features. In some implementations, epitaxial source/drain features 30 wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 12. Epitaxial source/drain features 30 are doped with n-type dopants and/or p-type dopants. In some implementations, where integrated circuit device 10 is configured as an n-type device (for example, having an n-channel), epitaxial source/drain features 30 are epitaxial layers including silicon and/or carbon, where silicon-containing epitaxial layers or silicon-carbon-containing epitaxial layers are doped with phosphorous, other n-type dopant, or combinations thereof (for example, forming a Si:P epitaxial layer or a Si:C:P epitaxial layer). In some implementations, where integrated circuit device 10 is configured as a p-type device (for example, having a p-channel), epitaxial source/drain features 30 are epitaxial layers including silicon and germanium, where the silicon germanium containing epitaxial layers are doped with boron, other p-type dopant, or combinations thereof (for example, forming a Si:Ge:B epitaxial layer). In some implementations, epitaxial source/drain features 30 include materials and/or dopants that achieve desired tensile stress and/or compressive stress in the channel region. In some implementations, epitaxial source/drain features 30 are doped during deposition by adding impurities to a source material of the epitaxy process. In some implementations, epitaxial source/drain features 30 are doped by an ion implantation process subsequent to a deposition process. In some implementations, annealing processes are performed to activate dopants in epitaxial source/drain features 30 and/or other source/drain regions of integrated circuit device 10 (for example, HDD regions and/or LDD regions).

A multilayer interconnect (MLI) feature 40 is disposed over substrate 12. MLI feature 40 electrically couples various devices (for example, transistors, resistors, capacitors, and/or inductors) and/or components (for example, gate structures and/or source/drain features) of integrated circuit device 10, such that the various devices and/or components can operate as specified by design requirements of integrated circuit device 10. MLI feature 40 includes a combination of dielectric layers and conductive layers configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 40. In some implementations, vertical interconnect features and horizontal interconnect features have respective lengths and widths measured along the same direction, where vertical interconnect features have lengths greater than their widths, and horizontal interconnect features have lengths less their widths. During operation of integrated circuit device 10, the interconnect structures are configured to route signals between the devices and/or the components of integrated circuit device 10 and/or distribute signals (for example, clock signals, voltage signals, and/or ground signals) to the devices and/or the components of integrated circuit device 10. It is noted that though MLI feature 40 is depicted with a given number of dielectric layers and conductive layers, the present disclosure contemplates MLI feature 40 having more or less dielectric layers and/or conductive layers depending on design requirements of integrated circuit device 10.

In FIG. 1, MLI feature 40 includes one or more dielectric layers, such as an interlayer dielectric layer 42 (ILD-0) disposed over substrate 12, an interlayer dielectric layer 44 (ILD-1) disposed over ILD layer 42, an interlayer dielectric layer 46 (ILD-2) disposed over ILD layer 44, and an interlayer dielectric layer 48 (ILD-3) disposed over ILD layer 46. ILD layers 42-48 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In the depicted embodiment, ILD layers 42-48 are dielectric layers that include a low-k dielectric material (generally referred to as low-k dielectric layers). ILD layers 42-48 can include a multilayer structure having multiple dielectric materials. MLI feature 40 can further include one or more contact etch stop layers (CESL) disposed over substrate 12, such as a CESL 52 disposed between ILD layer 42 and ILD layer 44, a CESL 54 disposed between ILD layer 44 and ILD layer 46, and a CESL 56 disposed between ILD layer 46 and ILD layer 48. In some implementations, a CESL (not shown) is also disposed between substrate 12 and ILD layer 42. CESLs 52-56 include a material different than ILD layers 42-48, such as a dielectric material that is different than the dielectric material of ILD layers 42-48. In the depicted embodiment, where ILD layers 42-48 include a low-k dielectric material, CESLs 52-56 include silicon and nitrogen (for example, silicon nitride or silicon oxynitride). ILD layers 42-48 and/or CESLs 52-56 are formed over substrate 12, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layers 42-48 and/or CESLs 52-56 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 42-48 and/or CESLs 52-56, a CMP process and/or other planarization process is performed, such that ILD layers 42-48 and/or CESLs 52-56 have substantially planar surfaces.

A device-level contact 60, a device-level contact 62, a device-level contact 64, a via 70, a via 72, a via 74, a conductive line 80, a conductive line 82, and a conductive line 84 are disposed in ILD layers 42-48 to form interconnect structures. Device-level contacts 60-64 (also referred to as local interconnects or local contacts) electrically couple and/or physically couple IC device features to other conductive features of MLI feature 40. For example, device-level contact 60 is a metal-to-poly (MP) contact, which generally refers to a contact to a gate structure, such as a poly gate structure or a metal gate structure. In the depicted embodiment, device-level contact 60 is disposed on gate structure 20B (in particular, metal gate stack 22B), such that device-level contact 60 connects gate structure 20B to via 70. Device-level contact 60 extends through ILD layer 44 and CESL 52, though the present disclosure contemplates embodiments where device-level contact 60 extends through more than one ILD layer and/or CESL of MLI feature 40. In furtherance of the example, device-level contact 62 and device-level contact 64 are metal-to-device (MD) contacts, which generally refer to contacts to a conductive region of integrated circuit device 10, such as source/drain regions. In the depicted embodiment, device-level contact 62 and device-level contact 64 are disposed on respective epitaxial source/drain features 30, such that device-level contact 62 and device-level contact 64 connect epitaxial source/drain features 30 respectively to via 72 and via 74. Device-level contact 62 and device-level contact 64 extend through ILD layer 42, ILD layer 44, and CESL 52, though the present disclosure contemplates embodiments where device-level contact 62 and/or device-level contact 64 extend through more than one ILD layer and/or CESL of MLI feature 40. In some implementations, device-level contacts 60-64 are MEOL conductive features that interconnect FEOL conductive features (for example, gate structures 20A-20C and/or epitaxial source/drain features 30) to BEOL conductive features (for example, vias 70-74), thereby electrically and/or physically coupling FEOL conductive features to BEOL conductive features.

Vias 70-74 electrically couple and/or physically couple conductive features of MLI feature 40 to one another. For example, via 70 is disposed on device-level contact 60, such that via 70 connects device-level contact 60 to conductive line 80; via 72 is disposed on device-level contact 62, such that via 72 connects device-level contact 62 to conductive line 82; and via 74 is disposed on device-level contact 64, such that via 74 connects device-level contact 64 to conductive line 84. In the depicted embodiment, vias 70-74 extend through ILD layer 46 and CESL 54, though the present disclosure contemplates embodiments where vias 70-74 extend through more than one ILD layer and/or CESL of MLI feature 40. In some implementations, vias 70-74 are BEOL conductive features that interconnect MEOL conductive features (for example, device-level contacts 60-64) to BEOL conductive features (for example, conductive lines 80-84), thereby electrically and/or physically coupling MEOL conductive features to BEOL conductive features. In some implementations, MLI feature 40 further includes vias that are BEOL conductive features that interconnect BEOL conductive features in different ILD layers to one another, such as conductive lines 80-84 to conductive lines (not shown) disposed in other ILD layers (not shown) overlying ILD layers 42-48, thereby electrically and/or physically coupling BEOL conductive features of integrated circuit device 10.

Device-level contacts 60-64, vias 70-74, and conductive lines 80-84 include any suitable conductive material, such as Ta, Ti, Al, Cu, Co, tantalum nitride (TaN), titanium (Ti), titanium nitride (TiN), cobalt (Co), and/or other suitable conductive materials. Device-level contacts 60-64, vias 70-74, and conductive lines 80-84 are formed by patterning ILD layers 42-48 and/or CESLs 52-56. Patterning ILD layers 42-48 and CESLs 52-56 can include lithography processes and/or etching processes to form openings (trenches), such as contact openings and/or line openings in respective ILD layers 42-48 and/or CESLs 52-56. In some implementations, the lithography processes include forming a resist layer over respective ILD layers 42-48 and/or CESLs 52-56, exposing the resist layer to pattern radiation, and developing the exposed resist layer, thereby forming a patterned resist layer that can be used as a masking element for etching opening(s) in respective ILD layers 42-48 and/or CESLs 52-56. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layers 42-48, CESLs 52-56, device-level contacts 60-64, vias 70-74, and/or conductive lines 80-84.

Interconnect structures of MLI features, such as MLI feature 40, typically include copper. As IC technologies progress towards smaller technology nodes (such as 16 nm, 10 nm, 7 nm, 5 nm, and below) and MLI features become more compact, copper-based interconnect structures have been observed to degrade performance, develop voids (arising, for example, from higher aspect ratio interconnect openings), and increase resistance-capacitance (RC) delay in ICs. To compensate for these issues, IC manufacturers are exploring new materials for the interconnect structures, such as aluminum, tungsten, cobalt, and/or ruthenium. For example, cobalt and/or tungsten may be implemented in device-level contacts, such as device-level contacts 60-64, while aluminum and/or tungsten may be implemented in vias, such as vias 70-74. Cobalt, in particular, exhibits better sheet resistance and/or electromigration (EM) performance than traditional interconnect materials, such as copper, and is easily integrated into conventional IC fabrication processes. A via disposed on a device-level contact thus often includes a tungsten barrier layer disposed along sidewall surfaces and/or bottom surfaces of a via opening (defined, for example, by an ILD layer and/or the device-level contact) and a tungsten bulk layer disposed over the tungsten barrier layer, where the tungsten barrier layer and the tungsten bulk layer fill the via opening.

Though the tungsten bulk layer exhibits desirable sheet resistance and the tungsten barrier layer exhibits desirably low contact resistance, poor adhesion of the tungsten barrier layer to the sidewall surfaces and/or bottom surfaces of the via opening leads to significant damage of the device-level contact, particularly when the device-level contact includes cobalt. For example, BEOL processing associated with tungsten-containing vias (from, for example, depositing the tungsten bulk layer, planarizing the tungsten barrier layer and/or the tungsten bulk layer, and/or cleaning processes) and/or associated with conductive lines (for example, cleaning processes) of the interconnect structure have been observed to seep through gaps between the tungsten barrier layer and the ILD layer and attack material of the device-level contact (in particular, cobalt), degrading its performance. Such performance degradation is calamitous for cobalt-containing device-level contacts. For example, cobalt loss arising from exposure to chemicals during BEOL processing, such as CMP slurry (which is typically an acidic solvent), have been observed to cause significant yield loss of cobalt-containing device-level contacts, which is unacceptable for meeting shrinking technology node demands.

The present disclosure thus proposes vias that protect device-level contacts (and, in some implementations, conductive lines), particularly cobalt-containing device-level contacts, from post-process damage. In particular, vias disclosed in FIGS. 2A-2C below, which can be implemented in vias 70-74, include a multi-layer via barrier that adheres well to sidewall surfaces and/or bottom surfaces of a via opening (defined, for example, by an ILD layer and/or the device-level contact), eliminating (or significantly reducing) any loss of material of device-level contacts during BEOL processing. In particular implementations, the multi-layer via barrier includes a titanium layer and a titanium nitride layer, generally referred to as a Ti/TiN via barrier, which has been observed to enable low resistance while adhering sufficiently to the surfaces defining the via opening, thereby preventing damage to underlying conductive features. In some implementations, no changes in device performance were observed after BEOL processing. For example, comparing dark voltage contrast (DVC) images generated from e-beam inspection of surface charge after a CMP process of a conventional via having a tungsten barrier and a via having a Ti/TiN via barrier as described herein, it has been observed that the via having the Ti/TiN via barrier is voltage-contrast type defect free (indicating that no voids (resulting, for example, from cobalt loss during the CMP process) are present in the via and/or device-level contact), while the conventional via having the tungsten barrier has voltage-contrast type defects (indicating that voids, which can cause electrical shorts or opens, are present in the via and/or device-level contact). In another example, it has been observed that a via having the Ti/TiN contact barrier described herein can significantly reduce resistance (in some implementations, as much as 77%) between the via and other IC features. For example, in some implementations, the via having the Ti/TiN contact barrier is physically coupled to an FEOL feature, such as a via physically coupled to a resistor of integrated circuit device 10, where an interface between the via and the FEOL feature has been observed to exhibit reduced resistance. Different embodiments may have different advantages, and no particular advantage is required of any embodiment.

FIG. 2A is an enlarged fragmentary diagrammatic view of a portion A of integrated circuit device 10 when implementing an interconnect structure 100A, in portion or entirety, according to various aspects of the present disclosure. Interconnect structure 100A includes device-level contact 62, via 72, and conductive line 82, where via 72 extends through ILD layer 46 and CESL 54 to interconnect device-level contact 62 to conductive line 82. FIG. 2A has been simplified for the sake of clarity to better understand the inventive concepts of the present disclosure. Additional features can be added in interconnect structure 100A, and some of the features described below can be replaced, modified, or eliminated in other embodiments of interconnect structure 100A.

In FIG. 2A, device-level contact 62 includes cobalt (and is thus referred to as a cobalt-containing device-level contact). In some implementations, a volume of device-level contact 62 includes at least 65% cobalt. For example, device-level contact 62 includes a cobalt-containing bulk layer 102, which includes cobalt or a cobalt alloy (for example, including titanium, tungsten, nickel, phosphorous, boron, aluminum, tantalum, other suitable cobalt alloying material, or combinations thereof). In some implementations, cobalt-containing bulk layer 102 includes at least 50% cobalt. Device-level contact 62 further includes a capping layer 104 disposed on cobalt-containing bulk layer 102. In the depicted embodiment, capping layer 104 includes cobalt and silicon (for example, cobalt silicide). Though not depicted, in some implementations, device-level contact 62 includes a barrier layer and/or adhesion layer, where cobalt-containing bulk layer 102 is disposed over the barrier layer and/or adhesion layer. In some implementation, device-level contact 62 extends through an opening in one or more ILD layers and/or ESL layers. For example, cobalt-containing bulk layer 102 fills an opening defined by sidewalls of ILD layer 44 and/or CESL 52 and a bottom defined by metal gate stack 22B. In implementations where device-level contact 62 includes a barrier layer and/or other suitable device-level contact layer, the barrier layer and/or other suitable device-level contact layer conform to the opening, such that the barrier layer and/or other suitable device-level contact layer are disposed on the dielectric layer and the metal gate stack 22B and cobalt-containing bulk layer 102 is disposed on the barrier layer and/or other suitable device-level contact layer.

Via 72 fills a via opening having sidewalls defined by ILD layer 46, CESL 54, and capping layer 104 and a bottom defined by cobalt-containing bulk layer 102. Via 72 includes a multi-layer via barrier 110, such as a first via barrier layer 112 and a second via barrier layer 114. First via barrier layer 112 and second via barrier layer 114 are configured to facilitate adhesion of via 72 to surfaces defining the via opening, such as the sidewall surfaces defined by ILD layer 46, CESL 54, and capping layer 104 and bottom surface(s) defined by cobalt-containing bulk layer 102. First via barrier layer 112 is disposed on the sidewalls and the bottom of the via opening, such that first via barrier layer 112 is disposed on ILD layer 46, CESL 54, cobalt-containing bulk layer 102, capping layer 104. Second via barrier layer 114 is disposed on first via barrier layer 112, such that second via barrier layer 114 extends along the sidewalls and the bottom of the via opening defined by ILD layer 46, CESL 54, cobalt-containing bulk layer 102, capping layer 104. In the depicted embodiment, first via barrier layer 112 and second via barrier layer 114 have substantially uniform thicknesses. In some implementations, first via barrier layer 112 has a thickness of about 20 Å to about 90 Å, and second via barrier layer 114 has a thickness of about 1 Å to about 40 Å. In some implementations, a thickness of first via barrier layer 112 is greater than a thickness of second via barrier layer 114.

First via barrier layer 112 includes titanium (and is alternatively referred to as a titanium-containing barrier layer or a titanium barrier layer), and second via barrier layer 114 includes titanium and nitrogen (and is alternatively referred to as a titanium-and-nitrogen-containing barrier layer or a titanium nitride barrier layer). Titanium exhibits low resistance while adhering well to dielectric materials, such as ILD layer 46 and/or CESL 54, eliminating (or minimizing) any gaps formed between via 72 and ILD layer 46 and/or CESL 54. First via barrier layer 112 and second via barrier layer 114 thus prevent chemicals from attacking and/or consuming device-level contact 62 during subsequent processing, such as described herein. In some implementations, first via barrier layer 112 includes at least 90% titanium, and second via barrier layer 114 includes at least 90% combined of titanium and nitrogen. In some implementations, second via barrier layer 114 includes at least 35% titanium and at least 35% nitrogen. In some implementations, first via barrier layer 112 and second via barrier layer 114 are formed using deposition processes configured to provide high bottom coverage (HBC), which further enhances adhesion of multi-layer via barrier 110. For example, first via barrier layer 112 is formed by a PVD process or an ALD process, and second via barrier layer 114 is formed by a CVD process or a plasma-based or gas-based treatment process.

Via 72 further includes a via bulk (fill) layer 120 disposed over multi-layer via barrier 110. Via bulk layer 120 includes tungsten or a tungsten alloy (and is alternatively referred to as a tungsten-containing via bulk layer or a via bulk tungsten layer). In the depicted embodiment, via bulk layer 120 includes a tungsten-containing seed (or liner) layer 122 and a tungsten-containing bulk layer 124. Tungsten-containing seed layer 122 is disposed on second via barrier layer 114, such that tungsten-containing seed layer 122 extends along the sidewalls and the bottom of the via opening defined by ILD layer 46, CESL 54, cobalt-containing bulk layer 102, and capping layer 104. Tungsten-containing bulk layer 124 is disposed on tungsten-containing seed layer 122. In some implementations, tungsten-containing seed layer 122 has a thickness of about 1 Å to about 40 Å, and tungsten-containing bulk layer 124 has a thickness of about 100 nm to about 200 nm. In some implementations, tungsten-containing seed layer 122 is formed using an ALD process, and tungsten-containing bulk layer 124 is formed using a CVD process.

Conductive line 82 is disposed over via 72, for example, on multi-layer via barrier 110 and via bulk layer 120. Conductive line 82 includes copper or a copper alloy (and is alternatively referred to as a copper-containing line or a copper line). In the depicted embodiment, conductive line 82 includes a barrier layer 132 and a copper-containing bulk layer 134. Barrier layer 132 is disposed on multi-layer via barrier 110 and via bulk layer 120, and copper-containing bulk layer 134 is disposed on barrier layer 132. Barrier layer 132 includes titanium, tantalum, other suitable material, or combinations thereof. For example, barrier layer 132 includes TiN or TaN. In some implementations, barrier layer 132 is omitted from conductive line 82. Alternatively or additionally, conductive line 82 can include other conductive materials, such as tantalum, tantalum nitride, titanium, titanium nitride, aluminum, tungsten, polysilicon, cobalt, other suitable conductive materials, or combinations thereof.

FIG. 2B is an enlarged fragmentary diagrammatic view of portion A of integrated circuit device 10 when implementing an interconnect structure 100B, in portion or entirety, according to various aspects of the present disclosure. Interconnect structure 100B is similar to interconnect structure 100A, except capping layer 104 is omitted from device-level contact 62 in interconnect structure 100B. Via 72 thus fills a via opening having sidewalls defined by ILD layer 46 and CESL 54 and a bottom defined by cobalt-containing bulk layer 102, where multi-layer via barrier 110 enhances adhesion of via 72 to ILD layer 46 and/or CESL 54 while exhibiting low resistance. FIG. 2B has been simplified for the sake of clarity to better understand the inventive concepts of the present disclosure. Additional features can be added in interconnect structure 100B, and some of the features described below can be replaced, modified, or eliminated in other embodiments of interconnect structure 100B.

FIG. 2C is an enlarged fragmentary diagrammatic view of portion A of integrated circuit device 10 when implementing an interconnect structure 100C, in portion or entirety, according to various aspects of the present disclosure. Interconnect structure 100C is similar to interconnect structure 100A, except capping layer 104 is omitted from device-level contact 62 in interconnect structure 100C. Via 72 thus fills a via opening having sidewalls defined by ILD layer 46 and CESL 54 and a bottom defined by cobalt-containing bulk layer 102, where multi-layer via barrier 110 enhances adhesion of via 72 to ILD layer 46 and/or CESL 54 while exhibiting low resistance. Further, in contrast to interconnect structure 100A, via bulk layer 120 includes a cobalt-containing bulk layer 126 in interconnect structure 100C. Cobalt-containing bulk layer 126 includes cobalt or a cobalt alloy. In some implementations, cobalt-containing bulk layer 126 includes at least 50% cobalt. In some implementations, via bulk layer 120 further includes a cobalt-containing seed layer configured similar to tungsten-containing seed layer 122 of interconnect structure 100A. In some implementations, conductive line 82 includes cobalt or a cobalt alloy, instead of copper or a copper alloy. FIG. 2C has been simplified for the sake of clarity to better understand the inventive concepts of the present disclosure. Additional features can be added in interconnect structure 100C, and some of the features described below can be replaced, modified, or eliminated in other embodiments of interconnect structure 100C.

FIG. 3 is a flow chart of a method 200 for fabricating an interconnect structure, such as interconnect structures 100A-100C in FIGS. 2A-2C, according to various aspects of the present disclosure. At block 210, method 200 includes forming a device-level contact over a substrate. At block 220, a via is formed on the device-level contact. At block 230, a conductive line is formed on the via. At block 240, the method 200 may continue to complete fabrication of the interconnect structure. Additional steps can be provided before, during, and after method 200, and some of the steps described can be moved, replaced, or eliminated for additional embodiments of method 200.

FIG. 4 is a flow chart of a method 250 for fabricating a via of an interconnect structure, such as via 72 of interconnect structures 100A-100C in FIGS. 2A-2C, according to various aspects of the present disclosure. In some implementations, method 250 can be implemented in method 200 at block 220. At block 252, method 250 includes forming an opening in a dielectric layer overlying a conductive structure that includes cobalt. At block 254, a first via barrier layer that includes includes titanium is formed on sidewall surfaces and a bottom surface of the opening. At block 256, a second via barrier layer that includes titanium and nitrogen is formed on the first via barrier layer. At block, a via bulk layer is formed on the second via barrier layer, such that the first via layer, the second via layer, and the via fill layer fill the opening. Additional steps can be provided before, during, and after method 250, and some of the steps described can be moved, replaced, or eliminated for additional embodiments of method 250.

FIGS. 5A-5F are fragmentary diagrammatic views of an interconnect structure 300, in portion or entirety, at various fabrication stages (such as those associated with method 200 of FIG. 3 and/or method 250 of FIG. 4) according to various aspects of the present disclosure. Interconnect structure 300 includes a via that protects underlying conductive features, such as underlying MEOL features and/or BEOL features, from damage during subsequent processing, as described herein. FIGS. 5A-5F have been simplified for the sake of clarity to better understand the inventive concepts of the present disclosure. Additional features can be added in interconnect structure 300, and some of the features described below can be replaced, modified, or eliminated in other embodiments of interconnect structure 300.

In FIG. 5A, a substrate 310 is provided having a conductive feature 320 disposed thereover. Substrate 310 is similar to substrate 12 depicted and described in FIG. 1. In the depicted embodiment, conductive feature 320 is a MEOL feature, such as a cobalt-containing device-level contact similar to device-level contact 62 depicted and described in FIG. 1 and FIGS. 2A-2C. For example, conductive feature 320 includes a cobalt-containing contact layer 322, similar to cobalt-containing bulk layer 102, and a capping layer 324, similar to capping layer 104. Alternatively, in some implementations, conductive feature 320 is a cobalt-containing BEOL feature, such as a cobalt-containing conductive line of MLI feature 40. In some implementations, cobalt-containing contact layer 322 is formed by any suitable deposition process (for example, PVD, CVD, ALD, or other suitable deposition process) and/or annealing process. In some implementations, the deposition process uses a cobalt precursor, such as cyclopentadienyl cobalt dicarbonyl ($CpCo(CO)_2$), dicobalt hexcarbonyl tertbutylacctylene (CCTBA), cobalt tricarbonyl nitrosyl ($Co(CO)_3NO$), bis(cyclopentadienyl)cobalt ($Co(C_5H_5)_2, CpCo(CO)_2$), bis(ethylcyclopentadienyl)cobalt ($C_{14}H_{18}Co$), bis(pentamethylcyclopentadienyl)cobalt ($C_{20}H_{30}Co$), cobalt tris(2,2,6,6-tetramethyl-3,5-heptanedionate) ($Co(OCC(CH_3)_3CHCOC(CH_3)_3)_3$), bis(ethylcyclopentadienyl)cobalt ($C_{14}H_{18}Co$), other suitable cobalt precursor, or combinations thereof.

A dielectric layer 330, similar to ILD layers 42-48 depicted and described in FIG. 1 and FIGS. 2A-2C, is formed over conductive feature 320. For example, a CVD process is performed to deposit a low-k dielectric material over conductive feature 320, thereby forming dielectric layer 330. A CESL 332, similar to CESLs 52-56 depicted and described in FIG. 1 and FIGS. 2A-2C, can be formed over dielectric layer 330 before forming dielectric layer 330, though the present disclosure contemplates embodiments where CESL 332 is omitted from interconnect structure 300. CESL 332 includes a material having a different etching characteristic than a material of dielectric layer 330, such as silicon nitride.

In FIG. 5B, a via opening 340 is formed in dielectric layer 330 (and, in some implementations, CESL 332) by a patterning process. In the depicted embodiment, via opening 340 extends vertically through dielectric layer 330, CESL 332, and capping layer 324. Via opening 340 includes a sidewall 334 (defined by dielectric layer 330, CESL 332, and capping layer 324), a sidewall 336 (defined by dielectric layer 330, CESL 332, and capping layer 324), and a bottom 338 (defined by cobalt-containing contact layer 322) that extends between sidewall 334 and sidewall 336. The patterning process includes lithography processes and/or etching processes. For example, forming via opening 340 includes performing a lithography process to form a patterned resist layer over dielectric layer 330 and performing an etching process to transfer a pattern defined in the patterned resist layer to dielectric layer 330. The lithography process can include forming a resist layer on dielectric layer 330 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of dielectric layer 330. The etching process can include a dry etching process (for example, a reactive ion etching (RIE) process), a wet etching process, other suitable etching process, or combinations thereof. After the etching process, the patterned resist layer is removed from dielectric layer 330, for example, by a resist stripping process. In some implementations, the patterned resist layer is used as an etch mask to remove portions of CESL 332 and/or capping layer 324 to extend via opening 340, thereby exposing conductive feature 320. In some implementations, dielectric layer 330 and/or CESL 332 are used as etching masks to remove portions respectively of CESL 332 and/or capping layer 324. Various selective etching processes can be performed. Alternatively, the exposure process can be implemented or replaced by other methods, such as maskless lithography, electron-beam (e-beam) writing, ion-beam writing, and/or nanoimprint technology.

Figure 5D:
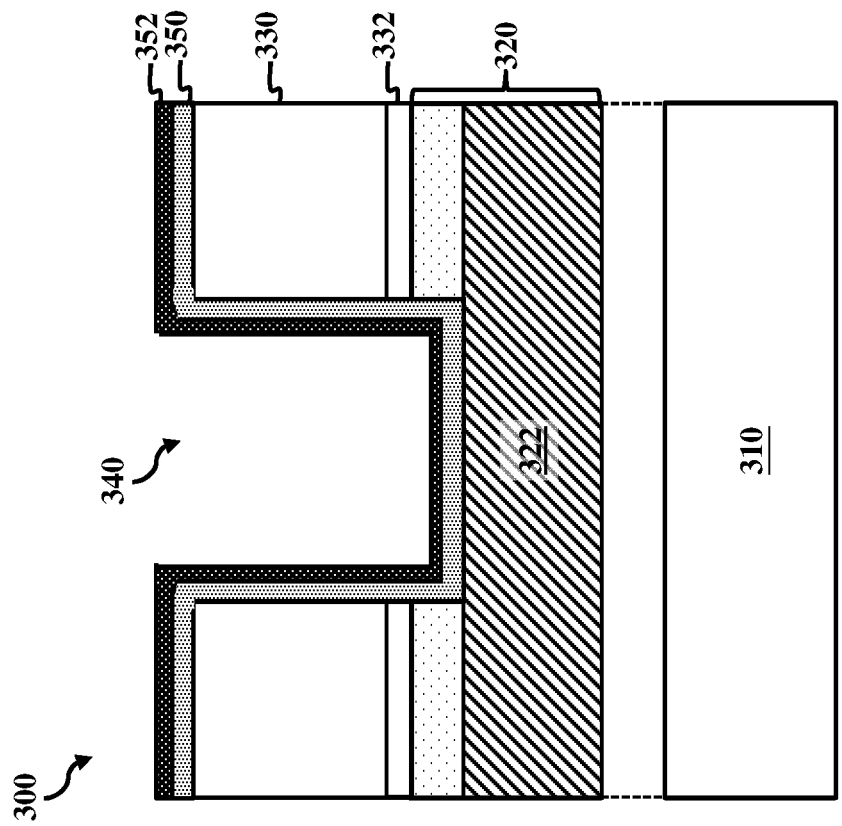
Figure 5C:
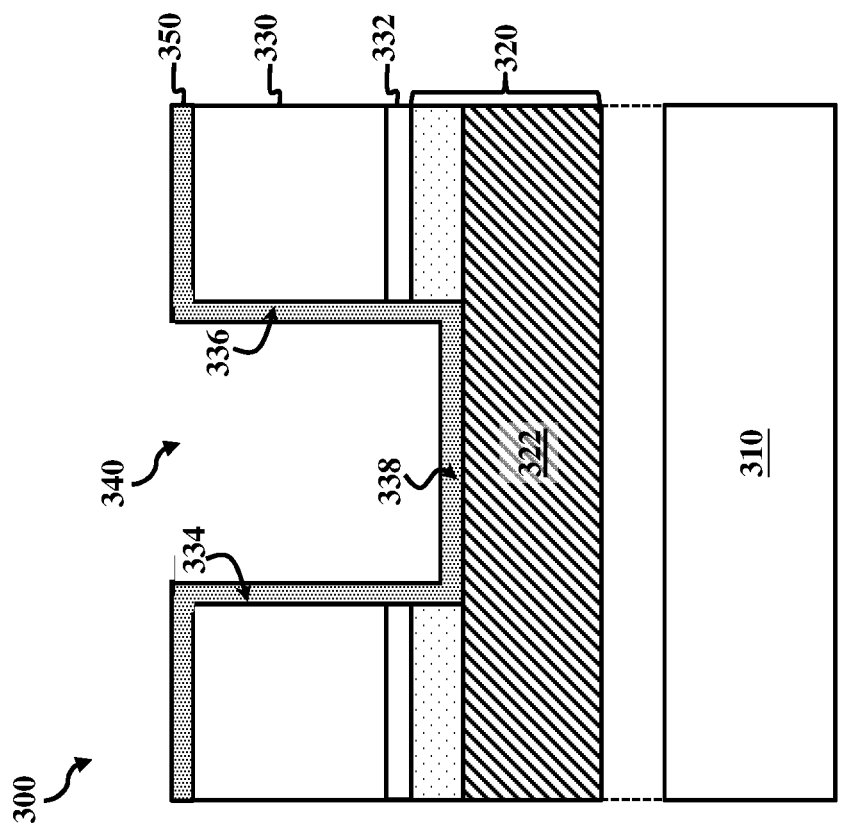

In FIG. 5C, a via barrier layer 350 is formed in via opening 340. Via barrier layer 350 is similar to first via barrier layer 112 depicted and described in FIGS. 2A-2C. For example, via barrier layer 350 is a titanium-containing layer. Via barrier layer 350 is disposed along sidewall 334, sidewall 336, and bottom 338 defining via opening 340, such that via barrier layer 350 partially fills via opening 340. In the depicted embodiment, via barrier layer 350 is disposed directly on portions of dielectric layer 330, CESL 332, and cobalt-containing contact layer 322 that define via opening 340. In furtherance of the depicted embodiment, a PVD process conformally deposits via barrier layer 350, such that via barrier layer 350 has a thickness that is substantially uniform over exposed surfaces of interconnect structure 300. Alternatively, via barrier layer 350 is formed by CVD, ALD, electroplating, electroless plating, other suitable deposition process, or combinations thereof.

In FIG. 5D, a via barrier layer 352 is formed in via opening 340. Via barrier layer 352 is similar to second via barrier layer 114 depicted and described in FIGS. 2A-2C. For example, via barrier layer 352 is a titanium-and-nitrogent-containing layer. Via barrier layer 352 is formed over via barrier layer 350, such that via barrier layer 352 partially fills via opening 340. In the depicted embodiment, via barrier layer 352 is disposed directly on via barrier layer 350. In furtherance of the depicted embodiment, a CVD process conformally deposits via barrier layer 352, such that via barrier layer 352 has a thickness that is substantially uniform over exposed surfaces of interconnect structure 300. Alternatively, via barrier layer 352 is formed by PVD, ALD, electroplating, electroless plating, other suitable deposition process, or combinations thereof.

Figure 5F:
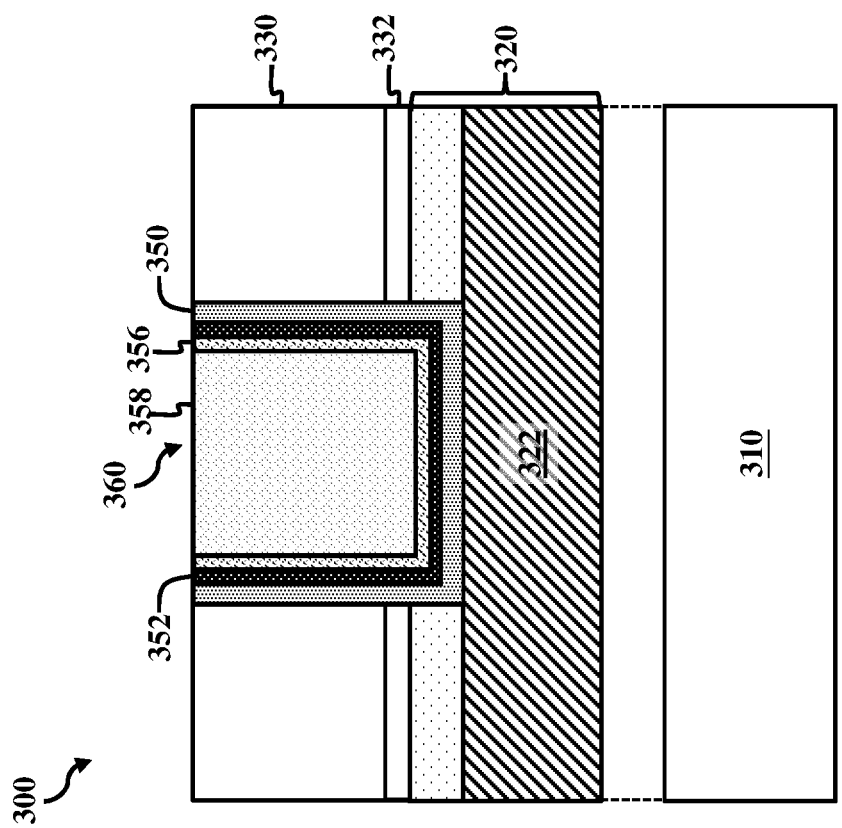
Figure 5E:
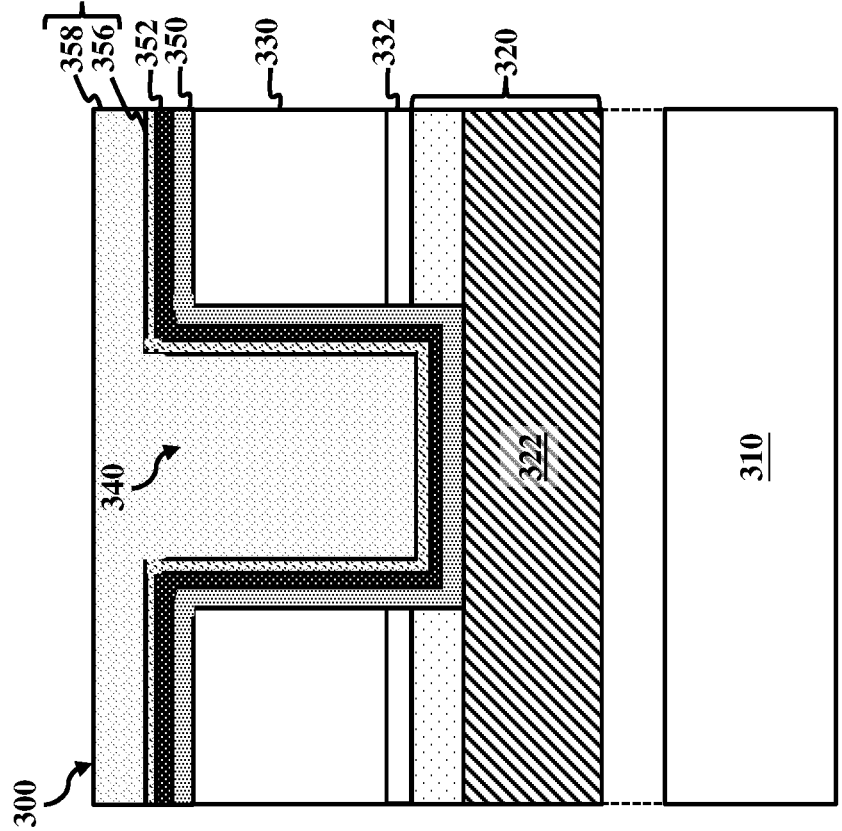

In FIG. 5E, a via bulk layer 354 is formed in via opening 340. Via bulk layer 354 is similar to via bulk layer 120 depicted and described in FIGS. 2A-2C. In the depicted embodiment, via bulk layer 354 is a tungsten-containing layer. For example, via bulk layer 354 includes a seed layer 356, such as tungsten-containing seed layer 122 depicted and described in FIG. 2A and FIG. 2B, and a fill layer 358, such as tungsten-containing bulk layer 124 depicted and described in FIG. 2A and FIG. 2B. Alternatively, via bulk layer 120 is a cobalt-containing layer, such as cobalt-containing bulk layer 126 depicted and described in FIG. 2C. Via bulk layer 354 is formed over via barrier layer 352, such that via bulk layer 354 fills any remaining via opening 340. In the depicted embodiment, seed layer 356 is disposed directly on via barrier layer 352, and fill layer 358 is disposed directly on seed layer 356. In furtherance of the depicted embodiment, an ALD process conformally deposits seed layer 356, such that seed layer 356 has a thickness that is substantially uniform over exposed surfaces of interconnect structure 300, and a CVD process deposits fill layer 358 over exposed surfaces of interconnect structure 300. Alternatively, via bulk layer 354, seed layer 356 and/or fill layer 358 are formed by PVD, CVD, ALD, electroplating, electroless plating, other suitable deposition process, or combinations thereof.

In FIG. 5F, a CMP process and/or other planarization process is performed on interconnect structure 300. The CMP process removes excessive via barrier layer 350, via barrier layer 352, and via bulk layer 354, resulting in a via 360 that includes via barrier layer 350, via barrier layer 352, and via bulk layer 354 (which fill via opening 340). The CMP process planarizes a top surface of interconnect structure 300, such that in some implementations, a top surface of dielectric layer 330 and a top surface of via 360 form a substantially planar surface. Thereafter, fabrication of interconnect structure 300 can continue with forming a conductive feature over via 360, where via 360 physically and/or electrically couples the conductive feature to conductive feature 320. For example, the conductive feature is a BEOL feature, such as conductive line 82 depicted and described in FIGS. 2A-2C. The conductive feature can be formed in a dielectric layer disposed over via 360 by implementing the deposition, lithography, and/or etching processes described herein.

The present disclosure provides for many different embodiments. Interconnect structures and corresponding techniques for forming the interconnect structures are disclosed herein. An exemplary interconnect structure includes a conductive feature that includes cobalt and a via disposed over the conductive feature. The via includes a first via barrier layer disposed over the conductive feature, a second via barrier layer disposed over the first via barrier layer, and a via bulk layer disposed over the second via barrier layer. The first via barrier layer includes titanium, and the second via barrier layer includes titanium and nitrogen. The via bulk layer can include tungsten and/or cobalt. A capping layer may be disposed over the conductive feature, where the via extends through the capping layer to contact the conductive feature. In some implementations, the capping layer includes cobalt and silicon. In some implementations, the conductive feature and the via are disposed in a dielectric layer. In some implementations, the conductive feature is a middle-end-of-line conductive feature. In some implementations, the conductive feature is a back-end-of-line conductive feature.

Another exemplary interconnect structure includes a cobalt-containing device contact disposed over a substrate and a dielectric layer disposed over the cobalt-containing device contact. A via is disposed in the dielectric layer. The via includes a titanium-containing barrier layer disposed over sidewall surfaces defined by the dielectric layer and a bottom surface defined by the cobalt-containing device contact, a titanium-and-nitrogen-containing barrier layer disposed over the titanium-containing barrier layer, and a bulk layer disposed over the titanium-and-nitrogen-containing barrier layer. In some implementations, the cobalt-containing device contact includes a cobalt-containing contact layer and a cobalt-and-silicon-containing capping layer disposed on the cobalt-containing contact layer. In such implementations, the via extends through the cobalt-and-silicon-containing capping layer to the cobalt-containing contact layer. In some implementations, the interconnect structure further includes a copper-containing conductive line, wherein the via interconnects the cobalt-containing device contact to the copper-containing conductive line.

An exemplary method includes forming an opening in a dielectric layer, wherein the opening overlies a conductive feature that includes cobalt. The method further includes forming a first via barrier layer over sidewalls and a bottom defining the opening, forming a second via barrier layer over the first via barrier layer, and forming a via bulk layer over the second via barrier layer. The first via barrier layer includes titanium, and the second via barrier layer includes titanium and nitrogen. The first via barrier layer, the second via barrier layer, and the via bulk layer fill the opening. In some implementations, the first via barrier layer is formed by performing a physical vapor deposition process. In some implementations, the second via barrier layer is formed by performing a chemical vapor deposition process. In some implementations, the method further includes forming a capping layer over the conductive feature. In some implementations, the capping layer includes cobalt and silicon.

Another exemplary method includes forming a middle-end-of-line (MEOL) feature over a substrate, wherein the MEOL feature includes cobalt and forming a back-end-of-line (BEOL) feature on the MEOL feature. Forming the BEOL feature includes forming a dielectric layer over the MEOL feature, patterning the dielectric layer to form an opening in the dielectric layer, wherein the opening has sidewalls defined by the dielectric layer and a bottom defined by an exposed portion of the MEOL feature, depositing a titanium-containing barrier layer on the sidewalls and the bottom of the opening, depositing a titanium-and-nitrogen-containing barrier layer on the titanium-containing barrier layer, depositing a bulk layer on the titanium-and-nitrogen-containing barrier layer, wherein the titanium-containing barrier layer, the titanium-and-nitrogen-containing barrier layer, and the bulk layer fill the opening, and performing a planarizing process on the titanium-containing barrier layer, the titanium-and-nitrogen-containing barrier layer, and the bulk layer, thereby planarizing a surface of the BEOL feature. In some implementations, the depositing the titanium-containing barrier layer includes performing a physical vapor deposition process. In some implementations, the depositing the titanium-and-nitrogen-containing barrier layer includes performing a chemical vapor deposition process. In some implementations, the forming the MEOL feature includes forming a cobalt-containing contact layer and forming a cobalt-and-silicon-containing contact layer over the cobalt-containing contact layer. The cobalt-containing contact layer and the cobalt-and-silicon-containing contact layer are disposed in another dielectric layer.

An exemplary integrated circuit device includes a back-end-of-line (BEOL) feature configured to electrically couple a cobalt contact feature to a conductive feature. The BEOL feature includes a titanium-containing barrier layer disposed on the cobalt contact feature, a titanium-and-nitrogen-containing barrier layer disposed on the titanium-containing barrier layer, and a bulk layer disposed on the titanium-and-nitrogen-containing barrier layer. In some implementations, the BEOL feature is a first BEOL feature, the cobalt contact feature is a middle-end-of-line (MEOL) feature, and the conductive feature is a second BEOL feature, such that the first BEOL feature electrically couples the MEOL feature to the second BEOL feature. In some implementations, the BEOL feature is a first BEOL feature, the cobalt contact feature is a second BEOL feature, and the conductive feature is a third BEOL feature, such that the first BEOL feature electrically couples the second BEOL feature to the third BEOL feature.

Another exemplary integrated circuit device includes a multilayer interconnect (MLI) feature that includes a device contact, a via, and a conductive line. The device contact is configured to electrically couple an integrated circuit device feature to the via. The via is configured to electrically couple the device contact to the conductive line. The via includes a first via barrier layer disposed on the device contact, wherein the device contact includes cobalt and the first via barrier layer includes titanium, a second via barrier layer disposed on the first via barrier layer, wherein the second via barrier layer includes titanium and nitrogen, and a via bulk layer disposed on the second via barrier layer. In some implementations, the device contact includes a contact layer that includes cobalt and a capping layer disposed on the contact layer, wherein the capping layer includes cobalt and silicon. In such implementations, the via extends through the capping layer to the contact layer. In some implementations, the integrated circuit device feature is a gate structure or a source/drain feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure comprising:
  a first interconnect feature and a second interconnect feature of a multilayer interconnect (MLI) feature disposed over a substrate, wherein the first interconnect feature includes cobalt;
  a via of the MLI feature, wherein the via is disposed between the first interconnect feature and the second interconnect feature, such that the via physically couples the first interconnect feature to the second interconnect feature, wherein the via includes:
    a first via barrier layer disposed directly on the first interconnect feature, wherein the first via barrier layer includes titanium,
    a second via barrier layer disposed directly on the first via barrier layer, wherein the second via barrier layer includes titanium and nitrogen, and
    a via seed layer disposed directly on the second via barrier layer, and
    a via bulk layer disposed directly on the via seed layer; and
  a capping layer disposed over the first interconnect feature, wherein the via extends through the capping layer to the first interconnect feature, wherein the capping layer includes cobalt and silicon.

2. The interconnect structure of claim 1, wherein the via bulk layer includes tungsten and the via seed layer includes tungsten.

3. The interconnect structure of claim 1, wherein the via bulk layer includes cobalt, and the via seed layer includes cobalt.

4. The interconnect structure of claim 1, wherein a thickness of the first via barrier layer is greater than a thickness of the second via barrier layer.

5. The interconnect structure of claim 1, wherein the first interconnect feature, the second interconnect feature, and the via are disposed in a dielectric material of the MLI feature.

6. The interconnect structure of claim 1, wherein the first interconnect feature is a middle-end-of-line interconnect feature, and the second interconnect feature is a back-end-of-line conductive feature.

7. The interconnect structure of claim 1, wherein the first interconnect feature is a back-end-of-line conductive feature, and the second interconnect feature is a back-end-of-line conductive feature.

8. The interconnect structure of claim 1, wherein the first via barrier layer includes at least 90% titanium, and the second via barrier layer includes at least 90% combined of titanium and nitrogen.

9. The interconnect structure of claim 1, wherein the first via barrier layer includes at least 90% titanium and the second via barrier layer includes at least 35% titanium and at least 35% nitrogen.

10. An interconnect structure comprising:
a first dielectric layer disposed on a substrate, a second dielectric layer disposed on the first dielectric layer, and a third dielectric layer disposed on the second dielectric layer;
a cobalt-containing device contact that extends through the first dielectric layer to an integrated circuit device feature disposed adjacent to the substrate, such that the cobalt-containing device contact is disposed on and connected to the integrated circuit device feature;
a via that extends through the second dielectric layer, such that the via is disposed on and connected to the cobalt-containing device contact, wherein the via includes:
a titanium-containing barrier layer disposed over sidewall surfaces defined by the second dielectric layer and a bottom surface defined by the cobalt-containing device contact,
a titanium-and-nitrogen-containing barrier layer disposed over the titanium-containing barrier layer, and
a bulk layer disposed over the titanium-and-nitrogen-containing barrier layer; and
a conductive line disposed in the third dielectric layer, such that the conductive line is disposed on the via, wherein the via connects the cobalt-containing device contact to the conductive line.

11. The interconnect structure of claim 10, wherein the cobalt-containing device contact includes:
a cobalt-containing contact layer; and
a cobalt-and-silicon-containing capping layer disposed on the cobalt-containing contact layer, wherein the via extends through the cobalt-and-silicon-containing capping layer to the cobalt-containing contact layer.

12. The interconnect structure of claim 10, wherein the conductive line is a copper-containing conductive line.

13. The interconnect structure of claim 10, wherein the titanium-containing barrier layer is formed by a physical vapor deposition process.

14. The interconnect structure of claim 10, wherein the titanium-and-nitrogen-containing barrier layer is formed by a chemical vapor deposition process.

15. The interconnect structure of claim 10, wherein the bulk layer includes:
a tungsten-containing seed layer; and
a tungsten-containing bulk layer disposed on the tungsten-containing seed layer.

16. The interconnect structure of claim 15, wherein the tungsten-containing seed layer is formed by an atomic layer deposition process and tungsten-containing bulk layer is formed by a chemical vapor deposition process.

17. A method comprising:
forming a first dielectric layer of a multi-layer interconnect feature (MLI) over a substrate;
forming a cobalt-containing conductive feature of the MLI feature in the first dielectric layer, wherein the cobalt-containing conductive feature extends through the first dielectric layer;
forming a second dielectric layer of the MLI feature over the first dielectric layer;
forming a via opening in the second dielectric layer that exposes the cobalt-containing conductive feature, wherein the via opening has sidewalls defined by the second dielectric layer and a bottom defined by the cobalt-containing conductive feature;
forming a first via barrier layer over the sidewalls and the bottom of the via opening, wherein the first via barrier layer includes titanium;
forming a second via barrier layer over the first via barrier layer, wherein the second via barrier layer includes titanium and nitrogen;
forming a via bulk layer over the second via barrier layer, wherein the first via barrier layer, the second via barrier layer, and the via bulk layer combine to fill the opening and form a via of the MLI feature that extends through the second dielectric layer;
forming a third dielectric layer of the MLI feature over the second dielectric layer; and
forming a conductive feature of the MLI feature in the third dielectric layer, such that the conductive feature is disposed over the conductive feature, wherein the via physically couples the cobalt-containing conductive feature to the conductive feature.

18. The method of claim 17, wherein the forming the first via barrier layer includes performing a physical vapor deposition process.

19. The method of claim 17, wherein the forming the second via barrier layer includes performing a chemical vapor deposition process.

20. The method of claim 17, further comprising forming a capping layer over the cobalt-containing conductive feature, wherein the capping layer includes cobalt and silicon, and further wherein the via opening extends through the capping layer.

* * * * *